(12) United States Patent
Jeng et al.

(10) Patent No.: US 6,886,735 B2
(45) Date of Patent: May 3, 2005

(54) METHOD OF THERMOSONIC WIRE BONDING PROCESS FOR COPPER CONNECTION IN A CHIP

(75) Inventors: Yeau-Ren Jeng, Tainan (TW); Chang-Ming Wang, Kaohsiung (TW)

(73) Assignee: National Chung Cheng University, Chia-Yi (TW)

( * ) Notice: Subject to any disclaimer, the term of this patent is extended or adjusted under 35 U.S.C. 154(b) by 131 days.

(21) Appl. No.: 10/340,756

(22) Filed: Jan. 13, 2003

(65) Prior Publication Data

US 2004/0108362 A1 Jun. 10, 2004

(30) Foreign Application Priority Data

Dec. 6, 2002 (TW) .......................... 091135491

(51) Int. Cl.⁷ ............................................. B23K 31/00
(52) U.S. Cl. .................................... 228/180.5; 228/208
(58) Field of Search ............................. 228/1.1, 110.1, 228/180.5, 208, 214; 257/778, E21.511; 438/613

(56) References Cited

U.S. PATENT DOCUMENTS

| | | | | |
|---|---|---|---|---|
| 4,437,604 A | | 3/1984 | Razon et al. ............... | 228/179 |
| 5,058,799 A | * | 10/1991 | Zsamboky ................ | 228/124.1 |
| 5,116,783 A | * | 5/1992 | Tsumura ...................... | 29/827 |
| 6,082,610 A | * | 7/2000 | Shangguan et al. .... | 228/180.22 |
| 6,207,551 B1 | * | 3/2001 | Chungpaiboonpatana et al. .......................... | 438/617 |
| 6,250,541 B1 | * | 6/2001 | Shangguan et al. ......... | 228/208 |
| 6,373,137 B1 | * | 4/2002 | McTeer ...................... | 257/762 |
| 6,510,976 B2 | * | 1/2003 | Hwee et al. ........... | 228/180.22 |
| 6,610,601 B2 | * | 8/2003 | Li et al. ..................... | 438/687 |
| 2001/0035452 A1 | * | 11/2001 | Test et al. ................. | 228/180.5 |

FOREIGN PATENT DOCUMENTS

TW    288668    1/1985

* cited by examiner

Primary Examiner—Kiley Stoner
Assistant Examiner—Jonathan Johnson
(74) Attorney, Agent, or Firm—Troxell Law Office PLLC

(57) ABSTRACT

A method of thermosonic wire bonding process for copper connection in a chip comprises controllable time, controllable temperature, and controllable humidity in an artificial circumstance, which generates copper oxide film on a surface of copper chip. The thickness of the film is in the range of 8050 Å to 8200 Å. Therefore, this invention provides the thermosonic wire bonding process for improvement of efficiency and quality.

2 Claims, 3 Drawing Sheets

METHOD OF THERMOSONIC WIRE BONDING PROCESS FOR COPPER CONNECTION IN A CHIP

REFERENCE CITED

1. U.S. Pat. No. 4,437,604.
2. Taiwan Patent Number: 288,668.

FIELD OF THE INVENTION

The present invention relates to a method of thermosonic wire bonding process for copper connection in a chip. More particularly, the chemical characteristic of the material of the copper connection in a chip makes it overcome the problem of wire bonding in electronic packaging without adding many complicated processing devices. The yield rate is increased, the cost is reduced, and the economic benefit is therefore more efficient.

BACKGROUND OF THE INVENTION

While sizes of electronic devices are becoming smaller and their speeds are increasing, the raising density of circuits develops the very large scale integrated circuits. The metal wires in chips also become narrower, which results in a higher resistance and a larger capacitance. However, the signal transmission speed of traditional metal connection structure is far behind that of current devices. With the improvement of devices this kind of signal transmission delay will occur more and more frequently. Accordingly, the current best choice is to replace the traditional aluminum wire with the copper wire. However, it is quite troublesome that the copper interconnected chip in the wire bonding process is very difficult for bonding, since it is so easy to oxidize in high temperature that the copper oxide film is soft and lacks the protection ability. This is also an unsolved problem for many electronic packaging factories.

The wire bonding process is a key point for signal transmission and power supply. Also, it is one of the most vulnerable parts in the packaging process. Therefore, the wire bonding process plays an important role in the electronic packaging process. The bonding pad made of the copper chip is different from the traditional aluminum bonding pad in the wire bonding process. Their material properties and oxides are totally different. The oxide layer of aluminum is a film of very good protection ability. However, the oxide layer of copper is soft and unable to form a delicate protection film and its thickness will increase along with the raising of time and temperature.

Because of the aforementioned difference of copper pad, during wire bonding, not only is the thermosonic vibration effect reduced, but the friction power of the thermosonic vibration is hard to be transmitted to the surface of the copper pad, which makes it unable to successfully connect to the copper pad, and, therefore reduces the yield rate of the bonding pad. During the wire bonding process of the bare copper chip, the key point for the yield rate of the bonding pad is to prevent the copper chip from quickly oxidizing due to the influence of the bonding interface temperature.

In order to prevent the copper chip from quickly oxidizing due to the influence of the bonding interface temperature, the surface of chip is spread with Argon while performing the thermosonic wire bonding of bare copper chip. Except for the protection of inert gas, the pre-heat temperature could also be decreased to reduce the oxidization of the copper pad. Sputtering a barrier layer on the surface of the copper chip, is another way. So far, the titanium metal layer is used as a barrier for preventing the copper chip from oxidization. The present invention utilizes the high temperature feather of copper materials and provides a method to improve wire bonding process for copper connection. The oxide film of the copper chip is generated naturally in air circumstance with controllable temperature and humidity. The thickness of the oxide film is controlled and becomes a barrier to prevent oxidization. This method is cost effective and can increase the bonding yield rate.

It can successfully bond the metal wire on the copper interconnected chip with good bonding pad strength by using the copper oxide film as barrier layer. The present invention provides a method of thermosonic wire bonding process for copper interconnected chip by using the copper oxide film as barrier layer.

SUMMARY OF THE INVENTION

The present invention provides a method of thermosonic wire bonding process for copper interconnected chip. It generates a copper oxide film in the range from 8050 Å to 8200 Å. By the barrier function of the copper oxide film, the bonding characteristic is improved.

BRIEF DESCRIPTION OF THE DRAWINGS

For a better understanding of the present invention as well as other objects and features, reference is made to disclose this invention taken in conjunction with drawings as follows.

DESCRIPTION OF THE PREFERRED EMBODIMENTS

The following descriptions of the preferred embodiments are provided to understand the features and the structures of the present invention.

Figure 1:
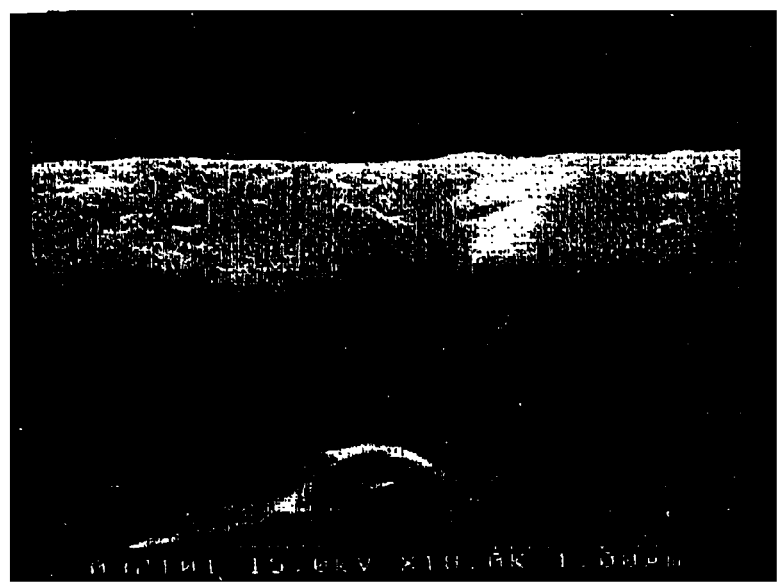
FIG. 1 is a scanning electron microscope (SEM) picture, showing copper deposition and oxide layer on the surface of a chip.
Figure 2:
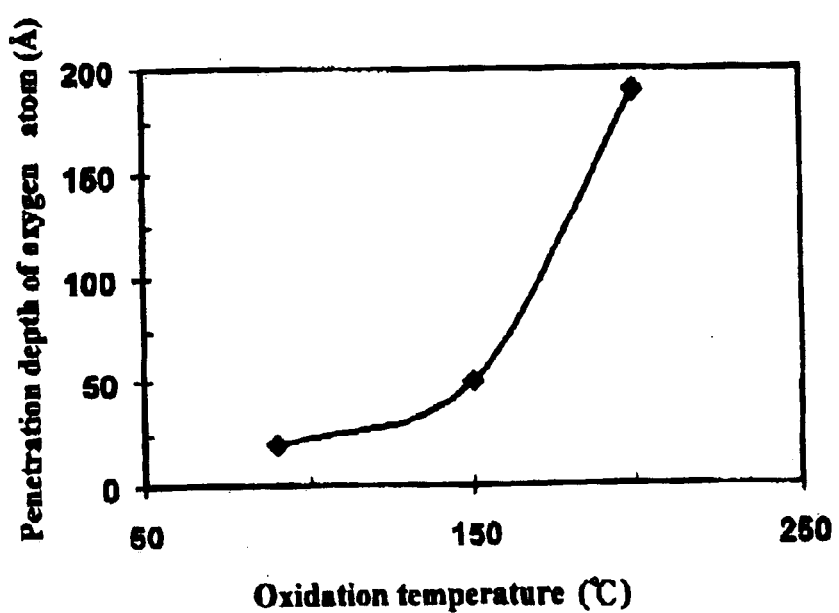
FIG. 2 is a diagram showing the penetration depth of copper oxide under different heating temperatures.
Figure 3:
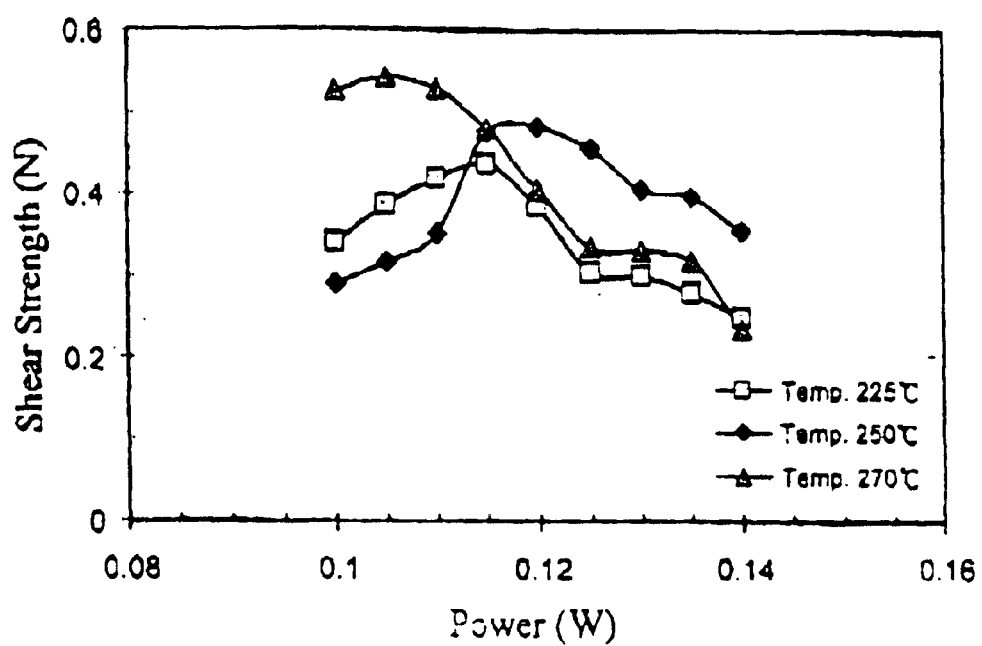
FIG. 3 is a diagram showing the relationship between the bonding pad strength and the thermosonic power.

Please refer to FIG. 1 to FIG. 3, showing the SEM picture of the copper deposition on the surface of a chip when bonding, the penetration depth of copper oxide under different heating temperatures, and the relationship between the bonding pad strength and the thermosonic power of the copper oxide film chip. As shown in those diagrams, the present invention makes use of the generation of the copper oxide film for wire bonding. It has been discovered that within a specific thickness range, the copper oxide film is good for the bonding pad quality of the thermosonic wire bonding. Too large copper oxide film might lead to bad bonding pad quality, or even make the bonding process impossible. Therefore, a copper oxide film of in the range from 8050 Å to 8200 Å is generated on the copper chip. By the barrier function of the copper oxide film, the bonding characteristic between the signal lines is improved. The oxide film on the surface of the copper chip grows rapidly in high pre-heating temperature during the thermosonic wire bonding process. By the experiment of wire bonding, the present invention analyzes the influence of the copper oxide film on the wire bonding process, and further analyzes the thermosonic bonding interface to provide a method for improvement;

The present invention provides a detail exemplary technique method of thermosonic wire bonding process for copper interconnected chip. The thickness of the copper film (the thickness between the oxide film and the copper chip metal layer) in the thermosonic bonding process is about in the range from 8050 Å to 8200 Å. If the chip keeps oxidizing, the thickness of the copper oxide film will be too large for the thermosonic wire bonding.

As the copper deposition of scanning electron microscope (SEM) picture shown in FIG. 1, the present invention uses the oxide copper film chip, Additionally, the present invention must select pro=per operating parameters of the wire bonder, among which is the wire bonding time an important parameter. As shown in FIG. 2, in a constant 200° C. for 10 min, the penetration depth of copper oxide is about 200 Å; FIG. 3 is a diagram showing the relationship between the bonding pad strength and the thermosonic power of the copper oxide chip used in a wire bonding process.

The results show that the present invention provides great bonding pad strength and therefore is a creative and useful invention of the thermosonic wire bonding process for the copper chip.

As mentioned above, the present invention is creative, novel, and non-obvious. Any person skilled in the art can make equivalent modifications without departing from the scope of the present invention. Therefore, the scope of the present invention should depend on the following claims.

The above description is nothing but a preferred embodiment, which is not used in a limiting sense of the scope of the present invention. Therefore, various equivalent changes and modifications of the present invention, being apparent upon reference to the claims of the present invention, should fall within the scope of the present invention.

What is claimed is:

1. A method of thermosonic wire bonding process for copper connection in a chip by generating a copper oxide film in an artificial circumstance, the thickness of said oxide film being in the range of 8050 Å to 8200 Å, which is used for bonding.

2. The method of claim 1, wherein said artificial circumstance is a moisture-proof box and similar environment.

* * * * *